(12) United States Patent
Yagi

(10) Patent No.: US 6,549,021 B2
(45) Date of Patent: Apr. 15, 2003

(54) APPARATUS FOR MEASURING THE RATIO OF ELECTRICAL SIGNALS, ELECTRIC COMPONENT MEASURING INSTRUMENT, METHOD FOR CALIBRATING ELECTRIC COMPONENT MEASURING INSTRUMENTS AND METHOD FOR MEASURING THE RATIO OF ELECTRICAL SIGNALS

(75) Inventor: Kazuyuki Yagi, Hyogo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 40 days.

(21) Appl. No.: 09/764,830

(22) Filed: Jan. 17, 2001

(65) Prior Publication Data

US 2001/0009374 A1 Jul. 26, 2001

(30) Foreign Application Priority Data

Jan. 20, 2000 (JP) .................................... 2000-012174

(51) Int. Cl.[7] ............................................. C01R 27/08
(52) U.S. Cl. ....................................... 324/704; 324/713
(58) Field of Search ............................. 324/522, 654, 324/649, 691, 713, 715, 704; 356/5.1

(56) References Cited

U.S. PATENT DOCUMENTS

| 4,621,226 A | * | 11/1986 | Powell ........................ 324/649 |
| 5,019,781 A | * | 5/1991 | Tanimoto et al. ............ 324/649 |
| 5,058,146 A | * | 10/1991 | Dupoy ......................... 377/39 |
| 5,345,182 A | * | 9/1994 | Wakamatsu .................. 324/649 |
| 5,430,537 A | * | 7/1995 | Liessner et al. .............. 356/5.1 |
| 6,124,936 A | * | 9/2000 | Okamoto ..................... 356/406 |
| 2001/0009374 A1 | * | 7/2001 | Yagi ........................... 324/713 |

OTHER PUBLICATIONS

"HP8751A Network Analyzer Operation Manual", Instrument Specifications, HP Part No. 08751–90000, Aug. 1994.
"HP4291A RF Impedance/Material Analyzer Operation Manual Set", Calibration Concept, HP Part No. 04291–90010, Mar. 1994.

* cited by examiner

Primary Examiner—N. Le
Assistant Examiner—Walter Benson

(57) ABSTRACT

A ratio meter and apparatus for measuring electrical components with high stability and no effect on the circuit under test. Two input signals are switched by a switching means and the inputs to two measuring means are measured while keeping the switches in a first state and a second state to find the ratio of the measurements. The ratio to be measured, which is related to the above-mentioned input signals, and which forms a bilinear equation with the two ratios, one each obtained under the first and second state, are obtained from said ratios. Accurate calibration is performed and measurement of electrical and electronic components with high stability is accomplished by connecting a front-end circuit with the ratio meter.

10 Claims, 4 Drawing Sheets

APPARATUS FOR MEASURING THE RATIO OF ELECTRICAL SIGNALS, ELECTRIC COMPONENT MEASURING INSTRUMENT, METHOD FOR CALIBRATING ELECTRIC COMPONENT MEASURING INSTRUMENTS AND METHOD FOR MEASURING THE RATIO OF ELECTRICAL SIGNALS

BACKGROUND

1. Description of the Invention

The present invention pertains to electric measuring equipment in general and in particular to an apparatus that finds the ratio of electrical signals and measuring equipment that uses this apparatus.

2. Related Art

Technology for measuring the ratio between two electrical signals, such as network analyzers, apparatuses for measuring circuit elements, devices for measuring transmission or equipment for measuring phase and amplitude, etc., is used for many purposes. In particular, this ratio is a vector ratio when the electrical signals are alternating-current signals.

By means of prior art, two electrical signals to be determined are measured by separate measuring means and the ratio is found from the measurements that have been obtained where low precision is acceptable for the ratio measurement. Many network analyzers (for instance, Agilent 8715A marketed by Agilent Technology (Tokyo)) use this method.

Nevertheless, the conversion coefficient of the measuring means, that is, the ratio of the quantity to be measured and the measurement (usually a complex number), generally do not agree with the theoretical value due to differences in properties between the two measuring means. An error due to the above difference readily increases with an increase in frequency of the electrical signals to be measured.

One method of eliminating this difference is calibration, as long as the measuring means is linear. One method that is generally used for the calibration of the voltage ratio is the method whereby the output of one signal source is divided in two with a resistance-type distributor and the respective outputs are measured as input of the measuring means and the same measurements serve as the reference. However, by means of methods that use two measuring means, it is difficult to maintain 0.05% stability in terms of the amplitude of the measurements with changes in temperature of ±10° after calibration and stability of 0.03° in terms of phase due to differences in the properties of the respective structural parts.

The method whereby the same measuring means are used with the help of time division is employed as the ultimate method for minimizing and stabilizing the difference between the conversion coefficients of these measuring means. For instance, the method of time division is used with equipment for measuring impedance (for instance, Agilent 4294A made by Agilent Technology), which is one of the apparatuses used to measure circuit components, because stability of 0.05% in terms of the amplitude of the measurements (absolute value) and 0.03° or less in terms of phase is required.

The ratio meter of the prior art shown in FIG. 1 comprises switch means 9 for time-division multiplexing of input signals, terminal resistance 16 connected in series to the output side of this switch means, measuring means 100, and control and computation apparatus 30. Switch means 9 comprises input switches 6 and 8 connected to input terminals 2 and 4 and connections that include junctions 10 and 12. Junction 10 is also an input terminal of measuring means 100. Terminal resistance 16 is connected to junction 12.

Voltage U corresponding to the current that flows to the device under test is introduced to input terminal 2. On the other hand, voltage V that corresponds to the voltage applied to the device under test is introduced to input terminal 4.

Input switches 6 and 8 are in the first state, wherein input terminals 2 and 4 are exclusively connected to measuring apparatus 14 and terminal resistance 16, respectively, (as shown by the solid switch lead lines) in the first time interval. Here, measuring apparatus 14 measures voltage V and measurement u is stored in memory 22. Input terminal 4 terminates at terminal resistance 16.

Input switches 6 and 8 are in the second state, where input terminals 4 and 2 are exclusively connected to measuring apparatus 14 and terminal resistance 16, respectively, (as shown by the broken switch lead lines) in the next second time interval. Here, measuring apparatus 14 measures voltage V and measurement v is stored in memory 24. Input terminal 2 terminates at terminal resistance 16. Control and computation apparatus 30 obtains the operation timing of input switches 6 and 8, output switch 20, and other components, or accesses memories 22 and 24 in order to input measurements u and v and calculates their ratio v/u. The voltage ratio that is found from the corrected formula, which has been found during calibration of this ratio, is calculated.

In this case, even if the conversion coefficient of measuring means 100 changes with temperature, etc., for instance such that u and v become ku and kv, (kv)/(ku)=v/u then the ratio that is measured will not change. The hypothesis that the value of resistance R1 of input resistance (generally impedance, but resistance is used in the following discussion for purposes of clarity and understanding of the invention, and not as a limitation of the invention) of measuring apparatus 14 and the value of resistance R2 of terminal resistance 16 are equal must be valid in order to accurately calibrate and measure by this measuring method.

Nevertheless, it is difficult to keep R1 and R2 the same within a wide frequency range when the frequency of voltages U and V increases, and there are cases where input impedances looking into ratio measuring means 100 from input terminal 2 or 4 takes on different values, depending on the switching state. Therefore, voltage sources U and V changes and V/U itself also changes in accordance with the switch state.

The method has also been used whereby an attenuator is introduced in front of each of input terminals 2 and 4 so that the above-mentioned changes present in the connection state of the switches are attenuated. However, by means of this method, the undesirable effect often occurs wherein voltages U and V that are input to measuring means 100 are attenuated and their signal-to-noise ratio is reduced, resulting in a reduction in measurement precision.

SUMMARY OF THE INVENTION

The object of the present invention is an apparatus and a method for accurate calibration and stable measurement of the ratio of electrical signals without requiring an unnecessary attenuator, even if there is a difference in the input impedance.

Another object of the present invention is an apparatus for measuring electric components and a method of measuring electric components that uses these very stable ratio measurements.

The first apparatus for measuring the ratio of electrical signals pertaining to the present invention comprises a switch means that comprises a first input terminal that receives a first electrical signal, a second input terminal that receives a second electrical signal, and a first and a second output terminal, and that has a first state, wherein the first input terminal and the first output terminal are connected and the second input terminal and the second output terminal are connected, as well as a second state, wherein the first input terminal and the second output terminal are connected and the second input terminal and the first output terminal are connected; a first measuring means for measuring electrical signals received from the above-mentioned first output terminal having a first receiving terminal connected to the above-mentioned first output terminal; a second measuring means for measuring electrical signals received from the above-mentioned second output terminal having a second receiving terminal connected to the above-mentioned second output terminal; and a control and computation means, which is connected to the above-mentioned switch means and the above-mentioned first and second measuring means and receives the respective measurements of the above-mentioned electrical signals of the above-mentioned first and second measuring means with the above-mentioned switch means and the above-mentioned first and second state, respectively, and calculates the ratio to be measured related to the above-mentioned first and second electrical signals, which forms a bilinear equation with the ratio of the measurements of the above-mentioned electrical signals of the above-mentioned second measuring means to the measurements of the above-mentioned electrical signals of the above-mentioned first measuring means, from the value of the above-mentioned ratio under the above-mentioned first and second states.

By means of the above-mentioned structure, it is possible to accurately calculate the ratio to be measured without any effect during the measurements on the source that generates the ratio to be measured or any effect from changes due to drifting of the conversion coefficient of the first and second measuring means (or gain, i.e., the ratio of the measurements to the received electrical signals), etc., because the state of the switch means was held unchanged during measurement of the ratio.

The second apparatus for measuring the ratio of electrical signals pertaining to the present invention is an apparatus for measuring the ratio of electrical signals according to the first apparatus for measuring the ratio of electrical signals pertaining to the present invention, wherein the geometric mean of the values under the above-mentioned first and second states of the ratio of the measurements of the above-mentioned electrical signals becomes the above-mentioned ratio to be measured.

The calculations are thereby simplified when the ratio to be measured is the ratio between the first and second electrical signals and therefore, there is an advantage in terms of measuring speed and cost.

The third apparatus for measuring the ratio of electrical signals pertaining to the present invention is an apparatus for measuring the ratio of electrical signals according to the second apparatus for measuring electrical signals pertaining to the present invention, wherein the arithmetic mean of the values under the above-mentioned first and second states of the ratio of the measurements of the above-mentioned electrical signals becomes the above-mentioned ratio to be measured.

Calculations of the ratio to be measured can be completed with a further simplified calculation means by using the arithmetic mean as the above-mentioned ratio to be measured when the difference between the above-mentioned ratio of the measurements of electrical signals under the above-mentioned first and second states and the value of the ratios of the values under the above-mentioned first and second states is relatively small because of this type of structure.

The fourth apparatus for measuring the ratio of electrical signals pertaining to the present invention is an apparatus for measuring the ratio of electrical signals according to the first apparatus for measuring the ratio of electrical signals of the present invention, wherein the above-mentioned first and second electrical signals are alternating-current signals and the above-mentioned ratio to be measured is the vector ratio.

The relative amplitude and phase difference of some electrical signals to other electrical signals and the values related to these can be easily found as the vector ratio of alternating-current signals because of this type of structure. Moreover, [this type of structure] has an advantage in that accurate values can be presented for many purposes, such as circuit network analyzers, equipment for measuring circuit components, devices for measuring transmission volume, equipment for measuring phase and amplitude, devices for measuring physical amounts, etc.

The fifth apparatus for measuring the ratio of electrical signals pertaining to the present invention is an apparatus for measuring the ratio of electrical signals according to the fourth apparatus for measuring the ratio of electrical signals pertaining to the present invention, wherein the above-mentioned ratio to be measured is immittance of an electronic component.

Measurement of electric components, including calibration, is accurately performed and therefore, the precision and stability of apparatuses for measuring impedance and circuit network analyzers can be improved because of this type of structure.

The sixth apparatus for measuring the ratio of electrical signals pertaining to the present invention is an apparatus for measuring the ratio of electrical signals according to either the fourth or fifth apparatus for measuring the ratio of electrical signals pertaining to the present invention having a structure wherein heterodyne detection of the above-mentioned electrical signals is performed by the above-mentioned first and second measuring means prior to the above-mentioned measurement, further comprising a local generator means for generating local signals used in the above-mentioned detection.

The frequency bandwidth and the frequency upper limit of the electrical signals that will be measured can be enlarged [and raised] a step further with almost no increase in the difference in measurements of the ratio to be measured because of this type of structure.

The seventh apparatus for measuring electrical signals pertaining to the present invention is an apparatus according to any of the first through fifth apparatuses for measuring the ratio of electrical signals pertaining to the present invention, wherein at least one of the above-mentioned first and second electrical signals will be received by the above-mentioned switch means via an attenuator.

The effects during measurement on the generation source of the ratio to be measured are further minimized because of this type of structure.

The first apparatus for measuring electric components pertaining to the present invention comprises the above-mentioned fifth or six apparatus for measuring the ratio of electrical signals; a starting-signal source for generating starting electrical signals; a power-splitting means connected to the starting-signal source for the input of starting electrical signals and dividing [these signals] into excitation signals and the above-mentioned first electrical signals; and a bridge means, which is a directional bridge excited by the above-mentioned excitation signals comprising a measuring terminal for connection of the device under test to one side of the above-mentioned directional bridge and with which detection signals of the above-mentioned directional bridge are output from the same output terminal as the above-mentioned second electrical signals; wherein the above-mentioned ratio to be determined has a value related to immittance of the above-mentioned device under test. By employing this type of structure, the detection signal of the directional bridge are measured instead of current flowing through the device under test, and therefore, immittance can be measured over a broader band of higher frequency.

The first method of calibrating an apparatus for measuring electric components pertaining to the present invention is a method with which the above-mentioned first apparatus for measuring electric components is calibrated, comprising the steps of changing in succession the above-mentioned device under test by 3 different known impedances while keeping the above-mentioned switch means under the above-mentioned first state and determining the first constant group of the above-mentioned bilinear equation from the ratio to the above-mentioned first and second measurements in accordance with the above-mentioned known impedance; and changing in succession the above-mentioned device under test by 3 different known impedances while keeping the above-mentioned switch means under the above-mentioned second state and determining the first constant group of the above-mentioned bilinear equation from the ratio to the above-mentioned first and second measurements in accordance with the above-mentioned known impedance.

Three-point calibration is conducted whereby the above-mentioned device under test is changed in succession by three different known impedances without changing the state of the switch means and therefore, calibration reliability is improved because calibration is performed by this type of method.

The first method of measuring the ratio of electrical signals pertaining to the present invention comprises measuring the first received electrical signals pertaining to the above-mentioned first electrical signals with said first measuring means to obtain a first measurement and measuring the second received electrical signals pertaining to the above-mentioned second electrical signals to obtain a second measurement; measuring the third received electrical signals pertaining to the above-mentioned first electrical signals with the above-mentioned second measuring means to obtain a third measurement and measuring the fourth received electrical signals pertaining to the above-mentioned second electrical signals with the above-mentioned first measuring means to obtain a fourth measurement; and calculating the above-mentioned ratio to be measured pertaining to the ratio of the above-mentioned first and second measurements and the ratio of the above-mentioned third and forth measurements, wherein a measurement is obtained for a ratio to be measured, which forms a bilinear equation with the ratio of the first and second electrical signals exclusively input to the respective first and second measuring means connected to the respective first and second output terminals of a switch means that comprises a first input terminal that receives first electrical signals, a second input terminal that receives second electrical signals, and a first and second output terminal, and that has a first state, wherein the first input terminal and the first output terminal are connected and the second input terminal and the second output terminal are connected, as well as a second state, wherein the first input terminal and the second output terminal are connected and the second input terminal and the first output terminal are connected.

The switch means is kept under a constant state during measurement of the ratio and therefore accurate calculation of the ratio to be measured is possible without any effect during measurement on the generation source of the ratio to be measured and without any effect from changes due to drifting etc., of the conversion coefficient of the first and second measuring means (or gain, i.e., the ratio of the measurement to the received electrical signals), because this type of method is adopted.

Other embodiments of the present invention and their results will become obvious from the following description of the present specification.

DEFINITION OF THE SYMBOLS

Figure 1:
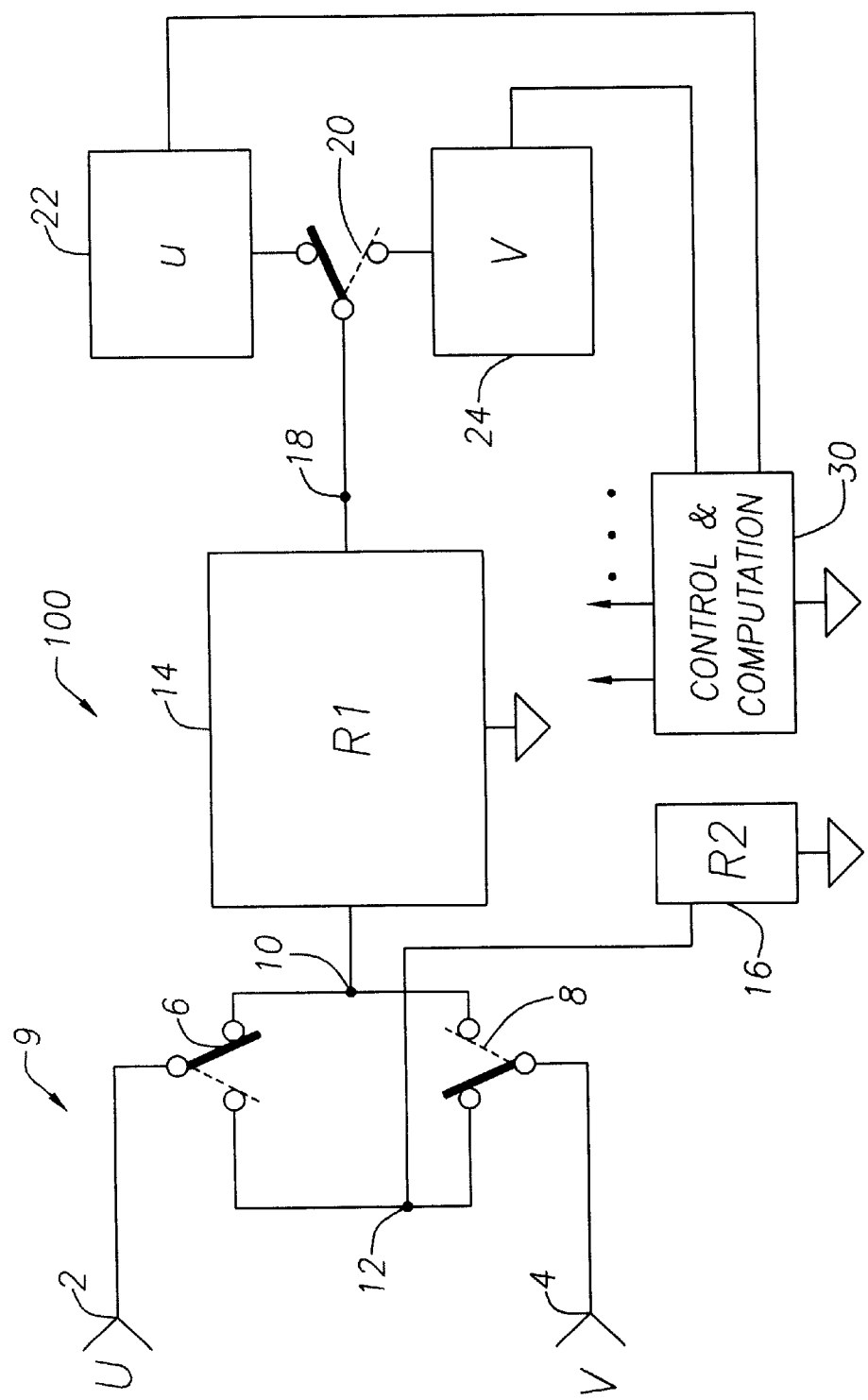
FIG. 1 is a block diagram of an apparatus for measuring electrical signals that uses input switches and a single measuring means of the prior art.

2,4: input terminals
6,8: input switches
9: switching means
10, 12: output terminals
14, 14a: measuring apparatuses
20, 20a: output switches
22, 24, 22a, 24a: memories
30, 40: control and computation means
200: apparatus for measuring the ratio of electrical signals (ratio meter)

DETAILED DESCRIPTION OF THE INVENTION

Figure 2:
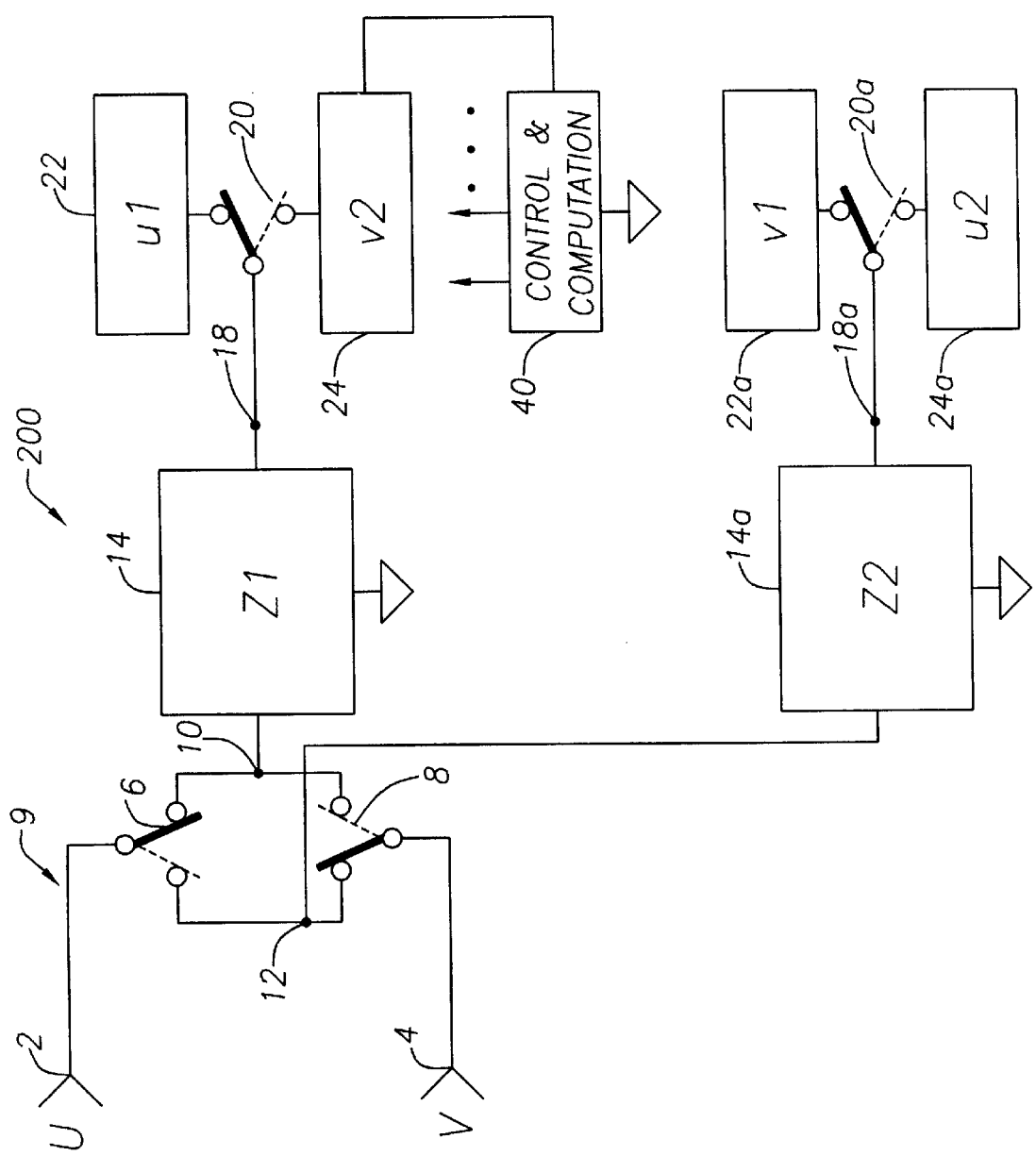
FIG. 2 is a schematic of a ratio meter of a preferred embodiment of the present invention.

FIG. 2 is a block diagram of a preferred embodiment of the present invention. The same reference numbers are used for structural elements with the same function as in FIG. 1. Moreover, structural elements having a reference number followed by a (for instance, 14a) have the same function as structural elements having reference numbers without this a (for instance, 14).

The apparatus for measuring the ratio of electrical signals, or ratio meter, 200 of the present invention, which is shown in FIG. 2, has input terminals 2 and 4 that input first and second electrical signals U and V (hereafter referred to as signals U and V for simplification of the description of the present invention), which can be voltage or current. The electrical signals that have been input are measured by a first measuring means consisting of measuring apparatus 14 and memories 22 and 24 and a second measuring means consisting of measuring apparatus 14a and memories 22a and 24a. It is preferred that the first and second measuring means have essentially the same structure. Next, control and computation apparatus 40 receives measurements from the measuring means and calculates and transmits or displays ratio V/U of values U and V of signals U and V and values pertaining to the same. Ratio V/U and values pertaining to the same are the measurement of the ratio V/U and values that are a function of this measurement.

Electrical signals U and V can also generally comprise direct-current and alternating-current signals. The ratio can be, for instance, the ratio of the effective values or the ratio of amplitudes (absolute values), the vector ratio, or combinations of these different measurements, for instance, the ratio of the effective value of signal U and the absolute value of signal V.

As is clear from comparing FIG. 1 with FIG. 2, ratio meter 200 is obtained by replacing terminal resistance 16 in FIG. 1 with a second measuring means and changing from control and computation apparatus 30 to control and computation apparatus 40, which is appropriate for this replacement. In describing ratio meter 200, the relative input impedances Z1 and Z2 of measuring apparatuses 14 and 14a function as the terminal components of the switch means. It is preferred that input impedances Z1 and Z2 be resistance, a constant component value during broadband measurement, but they are not necessarily the same. Electrical signals U and V can also generally be overlapping direct-current and alternating-current signals.

Signals U and V are respectively received at input terminals 2 and 4 and respectively fed into switches 6 and 8 of switch means 9. Junctions 10 and 12 serve as output terminals 10 and 12 of switch means 9 and reception terminals of apparatus 14 and 14a for measuring signals connected in succession. Switch 6 introduces signals U to either measuring apparatus 14 or measuring apparatus 14a. On the other hand, switch 8 introduces signals V to either measuring apparatus 14 or measuring apparatus 14a. When signal U is introduced to measuring apparatus 14, signal V is introduced to measuring apparatus 14a and when signal U is introduced to measuring apparatus 14a, signal V is introduced to measuring apparatus 14.

Switch means 9 can also be realized with a manual line. However, it is preferred that switches 6 and 8 be mechanical switches or a semiconductor switches, each of which is electrically controlled by control and computation apparatus 40. If a semiconductor switch is used, switch means 9 can also be integrated.

Control and computation apparatus 40 is a device that is based on one or multiple computers in which programs for conducting the necessary measurement procedures by ratio meter 200 are stored and is connected to switch means 9, measuring apparatuses 14 and 14a, and output switches 20 and 20a via a communications network that is not illustrated. Moreover, this apparatus 40 is joined as illustrated with memories 22, 22a, 24 and 24a and controls storage of data (measurements) in these memories as well as deletion and reading of these stored data, so that data are acquired from and sent to these memories. This apparatus 40 conducts a predefined operation on these data to obtain the desired results. Furthermore, when necessary, the measurement procedure and the structure of ratio meter 200 can be changed in accordance with the operation results.

Furthermore, it is preferable that the control and computation apparatus comprises an input-output interface such that data can be acquired from and sent to outside ratio meter 200, and so that control and synchronization with outside circuits and reception of commands from outside circuits are possible. It is also possible to distribute the measurement process, such as to perform part of the operations with outside computer equipment, by connecting apparatus 40 to the outside computer equipment, such as a server.

The other functions and properties of control and computation apparatus 40 can be easily deduced from the following description.

For convenience, the measuring procedure is described below by dividing the time during which this procedure is conducted into a first time interval and a subsequent second time interval. The order of the first and second time intervals can be reversed and the two time intervals can be discontinuous.

The following procedures are conducted based on control by control and computation apparatus 40 during the first time interval. Input switches 6 and 8 of switch means 9 are brought to the first state, wherein input terminals 2 and 4 are connected exclusively to measuring apparatus 14 and measuring apparatus 14a, respectively (as shown by the solid switch lead lines). Moreover, output switches 20 and 20a connected to output terminals 18 and 18a, respectively, of measuring apparatuses 14 and 14a are set up so that the measurements of measuring apparatuses 14 and 14a will be stored in memories 22 and 22a, respectively (as shown by the solid switch lead lines). Measuring apparatus 14 measures voltage U and measurement u1 is stored in memory 22. Measuring apparatus 14a measures voltage V and measurement v1 is stored in memory 22a. Measurements u1 and v1 are generally complex numbers.

During the next second time interval, input switches 6 and 8 are brought to the second state, where input terminals 4 and 2 are exclusively connected to measuring apparatus 14 and measuring apparatus 14a, respectively, (as shown by the broken switch lead lines). Moreover, output switches 20 and 20a connected to output terminals 18 and 18a, respectively, of measuring apparatuses 14 and 14a are set up so that measurements of measuring apparatuses 14 and 14a are stored in memories 24 and 24a, respectively (as shown by the broken switch lead lines). Measuring apparatus 14 measures voltage V and measurement v2 is stored in memory 24. Measuring apparatus 14a measures voltage U and measurement u2 is stored in memory 24a. Measurements u2 and v2 are generally complex numbers.

Measurements v1/u1=r1 and v2/u2=r2 of the ratios with the switch means under the first and second states are measured and then measurement r of the ratio to be measured V/U=R is given as the square root of (r1×r2), which is the geometric mean of the same. Measurement r of the ratio is found by control and computation apparatus 40. First, ratio r1 is calibrated under the first state so that the correct ratio r0 is obtained. In this case, for instance, v1=v10 and u1=u10. Next, ratio r2 is brought to the second state and then calibrated so that the correct ratio r0 is obtained. In this case, for instance, v2=v20 and u2=u20. Of course, r=the square root of (r1×r2)=the square root of (r0×r0)=r0.

This type of calibration is performed by physically changing the property values of the structural parts, or by storing correction factors in control and computation apparatus 40, or by both procedures. The method of storing correction factors in control and computation apparatus 40 is often used because it is inexpensive, with no change-over time to disrupt the reliability of the ratio meter, when compared to the method whereby property values of the structural components are changed. The second state can also be calibrated first.

If the conversion coefficients of the first and second measuring means (ratio of input and measurement) change over time or change with changes in the environment, such as temperature, etc., r1 and r2 will no longer be the correct values that they are immediately after calibration. Assuming that the conversion coefficients of the first and second measuring means are multiplied by a1 and a2, v1=a2×v10, u1=a1×u10, v2=a1×v20, and u2=a2×u20 and r1=(a2/a1)×r0 and r2=(a1/a2)×r0.

Nevertheless, by means of the present invention, r=the square root of (r1×r2) and therefore, the correct ratio is found by r=the square root of (a2/a1)×r0×(a1/a2)×r0)=r0. If r1 and r2 are almost equal, the geometric mean, the square root of (r1×r2), can also be approximated by the arithmetic mean, (r1+r2)/2.

In one example, (a2/a1) can be approximated with (1+m)(1+j×p) when the change in amplitude is m and the change in phase is p.

The data stored in memories 22, 24, 22a, and 24a have been described as measurements themselves. However, they can also be the results of performing a specific operation on measurements. For instance, the data may include the conversion of the coefficient of reflection to impedance and the mean of a predetermined number of measurements, etc.

As is seen with many commercial apparatuses for measuring electric components, when the above-mentioned electrical signals V and U correspond to the voltage applied to the device under test and current flowing through the device under test, the ratio of these electrical signals is impedance or admittance (abbreviated as immittance) and this immittance is directly calculated from the ratio of the measurements after conventional calibration.

An example of an apparatus for measuring electric components that is particularly useful for high-frequency, broad-band regions using the present invention will now be described.

Figure 3:
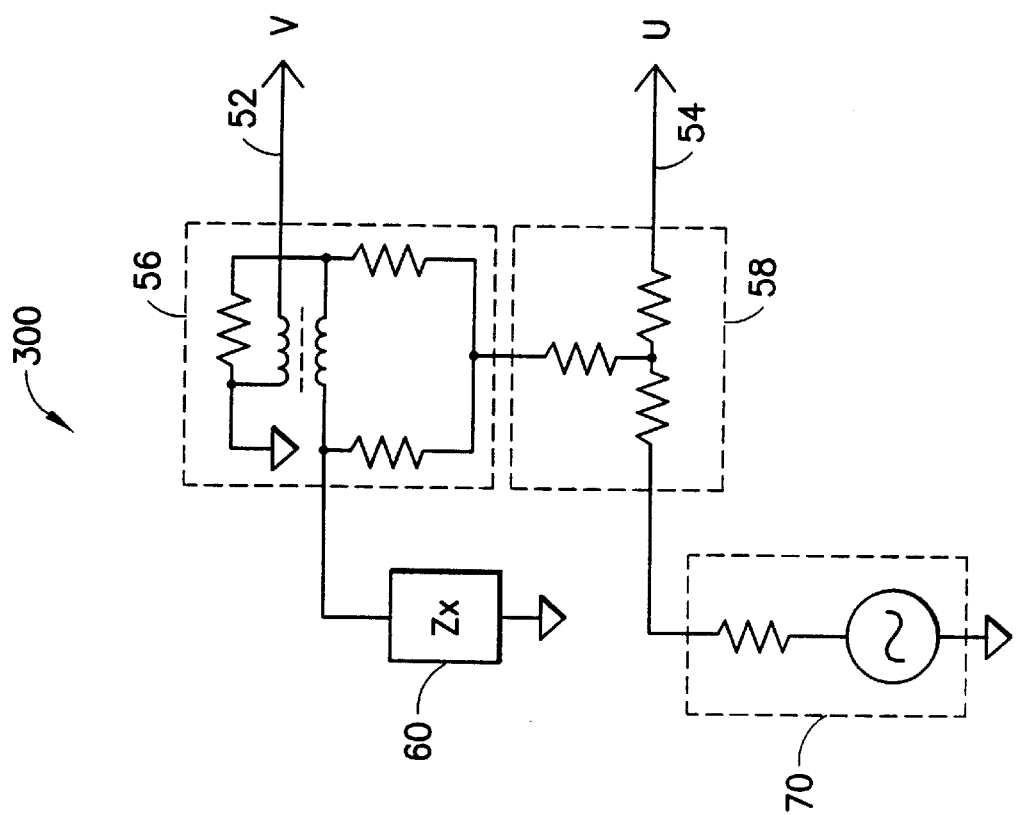
FIG. 3 is a general circuit diagram of a front-end circuit for the apparatus for measuring components of FIG. 2.

Front-end circuit 300 drawn in FIG. 3 is a conventional front-end circuit (or transducer) comprising, in combination with ratio reader 200 in FIG. 2, an apparatus for measuring electronic components, which measures the coefficient of reflection and immittance, etc., of device under test 60. Its operation will be described within the range necessary to understand the present invention. Electrical signals for measurement from signal source 70 are input to power-splitting means (power splitter) 58. Power splitter 58 introduces electrical signals for measurement as voltage U to output terminal 54 connected to input terminal 2 of ratio meter 200, and introduces the signals as excitation signals to directional bridge (hereafter also referred to as bridge) 56.

Device under test 60 is connected to one side of directional bridge 56 excited by excitation signals and detection signals of this directional bridge 56 are introduced as voltage V to output terminal 52 connected to input terminal 4 of ratio meter 200. The coefficient of reflection of the device under test is found from the voltage ratio given by ratio meter 200. Zx, that is, the impedance of device under test 60, is obtained at Zx=Z0×(1+r)/(1−r) from r=(Zx−Z0)/(Zx+Z0)=V/U. Z0 is characteristic impedance, for instance 50 Ω and 75 Ω, etc.

Prior to connecting device under test 60, a conventional 3-point calibration is performed by connecting in succession 3 known impedances, for instance, standard resistances with values of 0 Ω, 0 S, and 50 Ω in place of device under test 60 under the first state without changing the setup of switch means 9. Three-point calibration is a conventional method, even with 1-port calibration of circuit analyzers.

The same calibration is performed under the second state, changing the setup of switch means 9. At this time, even if Z1 and Z2 are different, the setup of the switch means during calibration does not change and therefore, calibration is correctly performed without changing the measuring state. Then the device under test is connected and the coefficient of reflection under the first and second states is measured. As with measurement of the voltage ratio, these two measurements coincide immediately after calibration. Although changes in properties of the measuring system due to changes in temperature after calibration will lead to differences in these two measurements, the correct value can be obtained, as in the case of measurements of the voltage ratio, by calculating changes that will occur in these two measurements.

Persons in the industry know that impedance Zx of device under test 60 is represented as Zx=(A×r+B)/(C×r+1) by the above-mentioned apparatus for measuring electric components that is a combination of ratio meter 200 shown in FIG. 2 and front-end circuit 300 shown in FIG. 3. Moreover, it is also known that constants A, B and C are determined by the above-mentioned 3-point calibration and therefore, a description is omitted.

When 3-point calibration is performed with switch means 9 under the first and second state, the following relationship applies $$Zx=(A1 \times r1+B1)/(C1 \times r1+1)=(A2 \times r2+B2)/(C2 \times r2+1) \quad \text{formula (1)}$$

at this time. Here, (r1, A1, B1 and C1) are the values of (r, A, B and C) with switch means 9 under the first state and (r2, A2, B2, and C2) are the values of (r, A, B and C) with switch means 9 under the second state.

Consequently, when the above-mentioned relationship is translated to the relationship for r1 and r2 and solved for r1, $$r1=(A3 \times r2+B3)/(C3 \times r2+1) \quad \text{formula (2)}$$

can be obtained. Here, A3=(A2−B1×C2)/(A1−B2×C1), B3=(B2−B1)/(A1B2×C1), C3=(A1×C2−A2×C1)/(A1−B2×C1).

Next, r1 changes to (a2/a1)×r1=r11 with changes in the conversion coefficient of the measuring means and r2 becomes (a1/a2)×r2=r21. Consequently, Zx cannot be obtained if (a2/a1) is not 1, even if these r11 and r21 values are substituted in formula (1). Nevertheless, formula (2) is established only for measuring the same device under test and therefore, the following formula (3) pertaining to (a1/a2) is obtained by substituting r1=r11/(a2/a1) and r2=(a2/a1)×r21 in formula (2).

$$r11/(a2/a1)=(A3 \times r21 \times (a2/a1)+B3)/(C3 \times r21 \times (a2/a1)+1) \quad \text{Formula (3)}$$

Formula (3) is the secondary formula related to (a2/a1) and when the appropriate solution is selected by solving for (a2/a1) and obtaining a value close to 1 for (a2/a1), it can be represented by the following formula (4):

$$(a2/a1)=\{-\beta+\sqrt{(\beta \times \beta - 4 \times \alpha \times \gamma)}\}/(2 \times \alpha) \quad \text{Formula (4)}$$

Here, α=A3×r21, β=B3−C3×r11×r21, and γ=−r11

If (a2/a1) is found, r1 and r2 are found from r1=r11/(a2/a1) and r2=(a2/a1)×r21 and thus, the correct Zx will be found by substituting these values in formula (1). If (A1×r1+B1)/(C1×r1+1) and (A2×r2+B2)/(C2×r2+1) in formula (1) are different, an error in the above-mentioned calculation can be estimated from the difference.

As previously described, the impedance of the device under test is the vector ratio, or the ratio to be measured between voltage signals applied to this device under test and electrical signals flowing through this device under test, and it is clear that even when this vector ratio forms a bilinear equation with the ratio of the measurements, the difference is eliminated by the conversion coefficient of the measuring means.

If $A=1$ and $B=C=0$ in the above-mentioned, $A3=1$ and $B3=C3=0$ and $\beta=0$, $\alpha=r21$ and $\gamma=-r11$ and therefore, $$(a2/a1)=\{-\beta+\sqrt{(\beta\times\beta-4\times\alpha\times\gamma)}\}/(2\times\alpha)=\{-0+\sqrt{(0\times0-4\times r21\times(-r11))}\}/(2\times r21)=(r21\times r11)/r21 \quad \text{Formula (5)}$$

is established.

That is, $r1=r11/(a2/a1)=r11\times r21/\sqrt{(r21\times r11)}=\sqrt{(r21\times r11)}$, or $r2=(a2/a1)\times r21=\sqrt{(r21\times r11)}/r21\times r21=\sqrt{(r21\times r11)}$. Consequently, the ratio that has been corrected as the geometric mean of the ratio in the first and second states will be measured.

Figure 4:
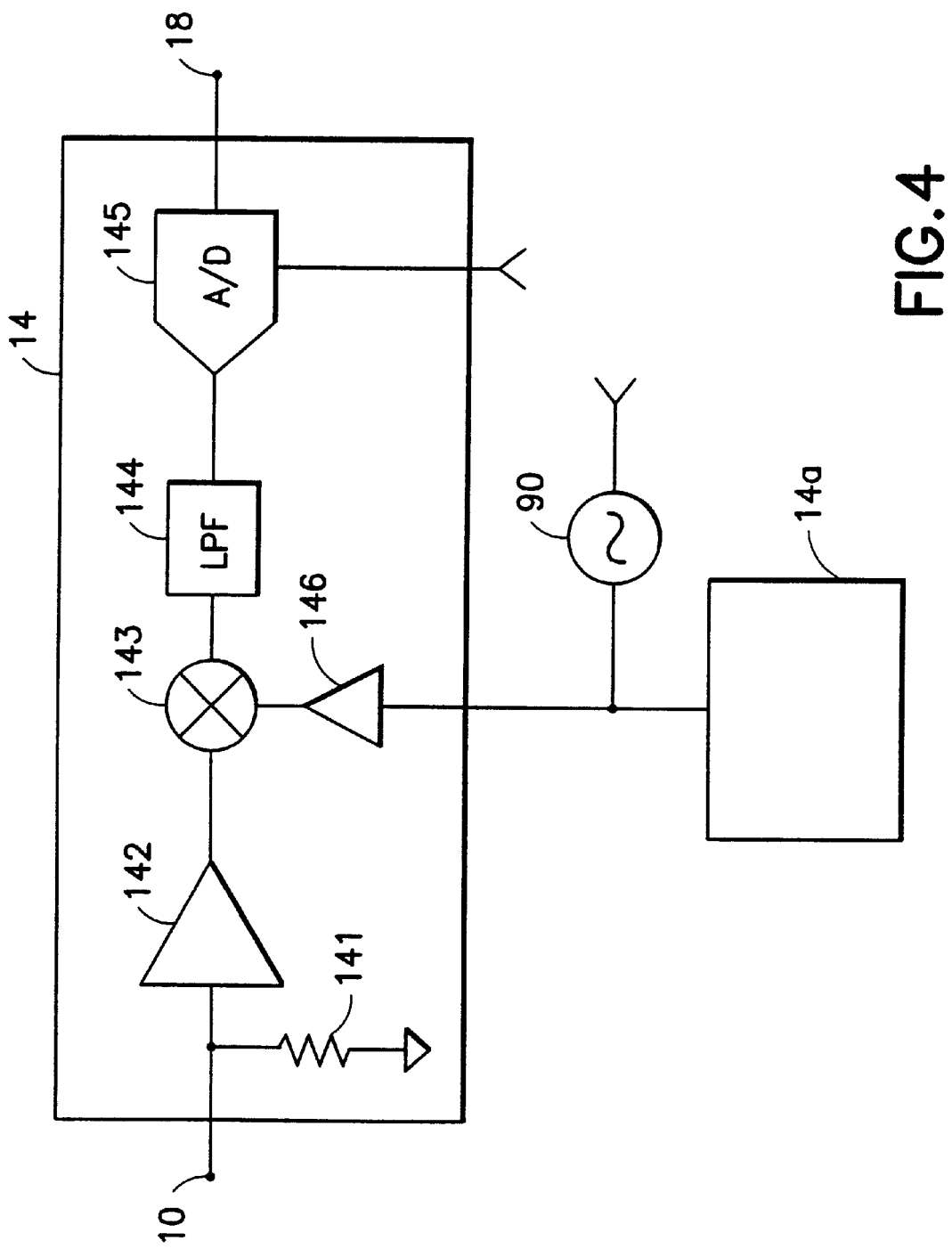
FIG. 4 is a schematic of an example of a ratio meter of a preferred embodiment of the present invention.

FIG. 4 is a block diagram of an example of measuring apparatuses 14 and 14a with essentially the same structure and providing particularly good results of the present invention. A detailed block diagram of measuring apparatus 14 only is shown. After amplification of the signals to be measured that had been input from input terminal 10 by amplifier 142, where the input terminal is terminated by terminal resistance 141, heterodyne detection is performed by mixer 143 and then [the signals] are converted to intermediate-frequency signals through low-pass filter 144.

These intermediate-frequency signals are sampled and digitized by A/D (analog-digital) converter 145 and the digitized signal values are output as measurements. Another input of mixer 143 for conducting heterodyne detection are local signals obtained from local generator means 90 through local amplifier 146. The local signals and the signals to be measured are related by control and computation apparatus 40 and the intermediate-frequency signals and sampled signals of A/D converter 145 are also related. In one example, intermediate-frequency signals are sampled at a rate of 4-times this intermediate frequency.

When this type of complex structure is employed, there is a difference in measurement of one of the measuring means with a change in phase properties of one local amplifier 146 as a result of changes in temperature. By means of the present invention, the ratio of the electrical signals is found with stability with respect to these changes in temperature, because it comprises 2 measuring means.

It should be understood that the foregoing description is only illustrative of the invention. The preferred embodiment examples of the present invention presented herein can be modified or revised by those skilled in the art without deviating from the invention. Consequently, the scope of the present invention is intended to encompass all such modifications and variances which fall within the appended claims.

What is claimed is:

1. An apparatus for measuring the ratio of electrical signals, comprising:
   a switch means comprising a first input terminal for receiving a first electrical signal, a second input terminal for receiving a second electrical signal, and a first and a second output terminal, said switch means having a first state, wherein said first input terminal and said first output terminal are connected and said second input terminal and said second output terminal are connected, and a second state, wherein said first input terminal and said second output terminal are connected and said second input terminal and said first output terminal are connected;
   a first measuring means for measuring electrical signals received from said first output terminal having a first receiving terminal connected to said first output terminal;
   a second measuring means for measuring electrical signals received from said second output terminal having a second receiving terminal connected to said second output terminal; and
   a control and computation means, which is connected to said first and second measuring means for receiving the respective measurements of said electrical signals of said first and second measuring means with said switch means in said first and second states, and calculates a ratio to be measured pertaining to said first and second electrical signals, which forms a bilinear equation with the ratio of the measurements of said electrical signals of said second measuring means to the measurements of said electrical signals of said first measuring means, from the value of said ratio under said first and second states.

2. The apparatus for measuring the ratio of electrical signals according to claim 1, wherein the geometric mean of the of the ratio of the measurements in said first and second states, is said ratio to be measured.

3. The apparatus for measuring the ratio of electrical signals according to claim 1, wherein the arithmetic mean of the ratio of the measured values, is said ratio to be measured.

4. The apparatus for measuring the ratio of electrical signals according to claim 1, wherein said first and second electrical signals are alternating-current signals and said ratio to be measured is the vector ratio.

5. The apparatus for measuring the ratio of electrical signals according to claim 4, wherein said ratio to be measured is an immittance of an electrical component.

6. The apparatus for measuring the ratio of electrical signals according to claim 4 having a structure wherein heterodyne detection of said electrical signals is performed by said first and second measuring means prior to said measuring, and further comprising a local generator means for generating local signals used in said detection.

7. The apparatus for measuring electrical signals according to claim 1, wherein at least one of said first and second electrical signals received by said switch means is received through an attenuator.

8. The apparatus for measuring electrical components according to claim 5, further comprising:
   a starting signal source for generating starting electrical signals;
   a power-splitting means connected to the starting-signal source for dividing said starting electrical signals into an excitation signal and said first electrical signal; and
   a directional bridge means comprising a measuring terminal for connection to said device under test on one side of said directional bridge and for the output of a detection signal of said directional bridge as said second electrical signals, wherein said ratio to be determined has a value related to the immittance of said device under test.

9. A method of calibrating an apparatus for measuring electrical components with which an apparatus for measuring electrical components according to claim 8 is calibrated, comprising the steps of:
   changing said device under test by three different known impedances while keeping said switch means in said first state and determining a first constant group of said bilinear equation from the ratio of said first and second measurements in accordance with said known impedance; and changing said device under test by three different known impedances while keeping said switch means in said second state and determining a first constant group of said bilinear equation from the ratio to said first and second measurements in accordance with said known impedances.

10. A method of measuring the ratio of electrical signals, comprising the steps of:

measuring a first received electrical signal pertaining to a first electrical signal with a first measuring means to obtain a first measurement;

measuring a second received electrical signal pertaining to a second electrical signal with a second measuring means to obtain a second measurement;

measuring a third received electrical signal pertaining to said first electrical signal with said second measuring means to obtain a third measurement;

measuring a fourth received electrical signal pertaining to said second electrical signal with said first measuring means to obtain a fourth measurement; and calculating a ratio to be measured pertaining to the ratio of said first and second measurements and the ratio of said third and fourth measurements, wherein a measurement is obtained for a ratio to be measured, which forms a bilinear equation with the ratio of said first and second electrical signals exclusively input to said first and second measuring means connected to a first and second output terminal of a switch means, said switch means comprising a first input terminal for receiving said first electrical signal; a second input terminal for receiving said second electrical signal; a first and second output terminal; and said switch means having a first state, wherein said first input terminal and said first output terminal are connected and said second input terminal and said second output terminal are connected, and a second state, wherein said first input terminal and said second output terminal are connected and the second input terminal and the first output terminal are connected.

* * * * *